United States Patent [19]

Ausschnitt

[11] Patent Number: 4,538,105
[45] Date of Patent: Aug. 27, 1985

[54] OVERLAY TEST WAFER
[75] Inventor: Christopher P. Ausschnitt, Southport, Conn.
[73] Assignee: The Perkin-Elmer Corporation, Norwalk, Conn.
[21] Appl. No.: 489,641
[22] Filed: Apr. 28, 1983

Related U.S. Application Data

[63] Continuation-in-part of Ser. No. 327,862, Dec. 7, 1981, Pat. No. 4,437,760.
[51] Int. Cl.³ .................. G01R 27/14; H01L 21/66
[52] U.S. Cl. .................. 324/158 R; 29/574; 324/65 R
[58] Field of Search .......... 324/158 R, 65 R, 62, 324/64; 430/30; 29/574; 355/133, 125

[56] References Cited

U.S. PATENT DOCUMENTS

| | | | |
|---|---|---|---|
| 3,743,417 | 7/1973 | Swatlak | 355/125 |
| 3,771,872 | 11/1973 | Nightingale et al. | 355/125 |
| 3,808,527 | 4/1974 | Thomas | 324/65 R |
| 3,873,203 | 3/1975 | Stevenson | 355/133 |
| 3,914,050 | 10/1975 | Dost et al. | 355/133 |
| 4,286,871 | 9/1981 | Erickson | 355/133 |
| 4,347,479 | 8/1982 | Cullet | 324/64 |
| 4,386,459 | 6/1983 | Boulin | 324/158 R X |
| 4,437,760 | 3/1984 | Ausschnitt | 355/133 |
| 4,475,811 | 10/1984 | Brunner | 324/158 R X |

OTHER PUBLICATIONS

J. Electrochem. Soc.: Solid State Science and Technology, Buehler, M., et al. "Bridge and Vnder Pauw Sheet Resistors..." 1978, pp. 650-654.
IEEE Journal of Solid-State Circuits, vol. SC-13, No. 4, Perloff, D., "A Four-Point Electrical Measurement Technique..." Aug. 1978, pp. 436-444.
SPIE, vol. 334, Optical Microlithography-Technology For the Mid-1980s, Berry, D., "Pattern Recognition Automatic File Alignment", 1982, pp. 10-16.
SPIE, vol. 334, Optical Microlithography-Technology For the Mid-1980s, Greed, J. Jr., "Variable Magnification In a 1:1 Projection Lithography...", 1982, pp. 2-9.
Technical Digest 1977 International Electron Devices Mtg. Dec. 5-7, Russell, T., et al. "A Comparison of Electrical and Visual Alignment...", pp. 7A-7F.
IEEE Transactions on Electron Devices, vol. ED-26, No. 4, Stemp, I, et al. "Automatic Testing and Analysis of Misregistrations Found in Semiconductor..." Apr. 1979, pp. 729-732.
Solid State Technology, Perloff, D., et al., "Microelectronic Test Structures for Characterizing Fine-Line Lithography", May 1981, pp. 126-140.
Solid State Technology, Carver, G, et al., "Use of Microelectronic Test Structures to Characterize IC Materials, Processes and Processing Eqpt., Sep. 1980, pp. 85-92.
Solid State Technology, Perloff, D., et al., "Real Time Monitoring of Semiconductor Process Uniformity", Feb. 1980 pp. 81-86.
Solid State Science and Technology, Nicholas, K., et al., "Alignment, and Mask Errors in IC Processing", Mar. 1981, pp. 609-614.
Fifteenth Symposium on Electron, Ion, and Photon Beam Technology, Boston, Bruning, J., "Performance Limits in 1:1 U.V. Projection, May 1979, pp. 26-34.

Primary Examiner—Stewart J. Levy
Assistant Examiner—Stephen M. Baker
Attorney, Agent, or Firm—Thomas P. Murphy; E. T. Grimes; F. L. Masselle

[57] ABSTRACT

The present invention is directed to an improved test wafer for testing the overlay alignment of a second level pattern over a first level pattern for testing lithographic equipment used in making microcircuits, which includes four conductors with circuitry provided for each conductor measuring the conductance thereof, the conductors being constructed and arranged so that the conductance of the first conductor relative to the second conductor, and the conductance of the third conductor relative to the fourth conductor is indicative of the offset of said first level pattern with respect to said second level pattern. In another form of the invention four additional conductors are provided with circuitry provided for each conductor for measuring the conductance thereof, the additional conductors being constructed and arranged so that the relative conductance thereof is indicative of the offset of said first level pattern with respect to said second level pattern in a direction orthogonal with respect to the offset of the first group of four conductors.

14 Claims, 8 Drawing Figures

OVERLAY TEST WAFER

This application is a continuation-in-part of my co-pending patent application entitled, "Reusable Electrical Overlay Measurement Circuit and Process" U.S. Pat. No. 4,437,760 filed Dec. 7, 1981, bearing Ser. No. 327,862.

FIELD OF THE INVENTION

This invention relates to microcircuits in general and more particularly to overlay test wafers, which are useful for testing lithographic equipment used in making microcircuits.

This application is closely related to patent application entitled, "Overlay Test Measurement Systems" filed on even date herewith and bearing Ser. No. 489,664, now U.S. Pat. No. 4,475,811, issued Oct. 9, 1984. The disclosure in said patent application is incorporated herein by reference.

BACKGROUND OF THE INVENTION

In a typical microcircuit there are seven layers of patterning. The size of a microcircuit is determined by the minimum possible line width and line spacings which can be obtained. These in turn are, in part determined by the accuracy with which one pattern can be placed on top of another. The smaller the error in overlay placement the greater the packing density which can be achieved. Typically, machines now being made for projection lithography have specifications of the order of ½ micron. This error is made up of two factors. One is an alignment error and the other is a distortion error. Alignment error is determined by the ability of the operator or automatic alignment system of the machine to position one pattern level over the another. Distortion is the error inherent in the imaging system of the machine. It is desired to be able to measure both types of error and to maintain accuracy within the prescribed limit with respect to both.

It is necessary that overlay accuracy measurements be made during production and initial calibration of machines and also periodically in service to assure that accuracy is being maintained. One way that this has been done in the past was to print vernier patterns on a substrate and optically to read these patterns. For example, a pattern consisting of a set of lines with a pitch of 10 microns would be placed next to another pattern with a pitch of 9.75 microns. If overlay were perfect, the two sets of lines would line up at their center and, going out from the center, each line of the second pattern would be progressively closer to the center than the corresponding line of the first pattern. If overlay were in error by 0.25 μm, then the two sets of lines would line up at a position displaced by one line from the pattern center.

Furthermore, in carrying out the measurements of this nature it should be noted that measurements are taken at a plurality of sites on a wafer and that checks are made in both the X and Y direction.

The main problem with optical measurements, other than the fact that they depend on human operators, is that they are limited in accuracy. In the above example, it is only possible to read to a quarter of a micron and to interpolate to an eighth of a micron. Thus, there have been proposals to utilize electrical techniques. The advantage of electrical techniques is that they permit automated and more accurate measurements utilizing probes at appropriate stations. Examples of literature describing prior art electrical measurement techniques are the following:

*Solid State Technology*, "Microelectronic Test Structures for Characterizing Fine-Line Lithography", D. S. Perloff, T. F. Hasan, D. H. Hwang and J. Frey, May, 1981, pp. 126–129 and 140.

*Solid State Technology*, "Use of Microelectronic Test Structures to Characterize IC Materials, Processes, and Processing Equipment,", G. P. Carver, L. W. Linholm and T. J. Russell, September, 1980, pp. 85–92.

*Solid-State Technology*, "Real-Time Monitoring of Semiconductor Process Uniformity," D. S. Perloff, T. F. Hasan and E. R. Blome, February, 1980, pp. 81–86.

*Solid State Science and Technology*, "Alignment, and Mask Errors in IC Processing," K. H. Nicholas, I. J. Stemp and H. E. Brockman, March, 1981, pp. 609–614.

*Fifteenth Symposium on Electron, Ion and Phonton Beam Technology*, "Performance Limits in 1:1 UV Projection Lithography," J. H. Bruning, May, 1979, pp. 1–8.

However, in the resistance measurements which are known in the prior art, first and second levels of a conductor are constructed such as to obtain a pair of resistors which, if the overlay is perfect will have equal values. The difference in resistance value is a measure of the offset error. However, using these prior art techniques, the first or base level was destroyed, by the overlay of the second layer, each time a test was carried out. This required having a large plurality of base patterns constructed for testing. However, it is difficult reproducibly and accurately to make base patterns. The base pattern must be as distortion-free as possible. This is normally accomplished by contact printing. However, there is a limit to the number of circuits which can be contact printed with a master mask. Thus, the ideal would be a base pattern which could be used over and over again for calibration, maintenance and so forth. With such a base pattern, since the same base pattern would be used from time to time, any changes would be caused by changes in the apparatus being tested and could not be attributed to a new base pattern. Over a period of time, in addition to saving time and money, the availability of a reusable base pattern would insure better accuracy and repeatability.

SUMMARY OF THE INVENTION

In order to accomplish the desired results, the invention provides, in one form thereof, a new and improved test wafer for testing the overlay alignment of a second level pattern over a first level pattern for testing lithographic equipment used in making microcircuits which includes four conductors with means provided for measuring the conductance of each of the conductors. The conductors are constructed and arranged so that the conductance of the first conductor relative to second conductor and the conductance of the third conductor relative to the fourth conductor is indicative of the offset of the first level pattern with respect to the second level pattern. According to one aspect of the invention the conductors are disposed in parallel relationship one with respect to the others. According to another aspect of the invention the means for measuring the conductance of the conductors comprises voltage pads, suitable for contacting by point contact, connected to each end of the conductors, respectively. According to still another aspect of the invention there is provided four additional conductors with means for measuring the conductance of each of them, respectively. These conductors are constructed and arranged so that the conductance of the fifth conductor relative to the sixth conductor and the conductance of the seventh conductor relative to the eighth conductor is indicative of the offset of the first level pattern with respect to the second level pattern in a direction orthogonal to the first four conductors.

There has thus been outlined rather broadly the more important features of the invention in order that the detailed description thereof that follows may be better understood, and in order that the present contribution to the art may be better appreciated. There are, of course, additional features of the invention that will be described hereinafter which will form the subject of the claims appended thereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Specific embodiments of the invention have been chosen for purposes of illustration and description, and are shown in the accompanying drawings, forming a part of the specification.

BRIEF DESCRIPTION OF THE DRAWINGS

FIG. 9 is an equivalent circuit of the arrangement shown in FIG. 8.

DETAILED DESCRIPTION OF THE INVENTION

Figure 1:
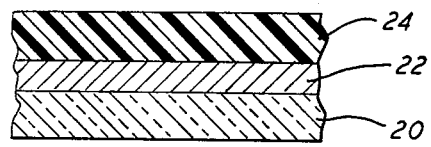
FIGS. 1 to 4 are enlarged, vertical sectional views of a test wafer showing the process steps leading to electrically probe-able patterns.
Figure 3:
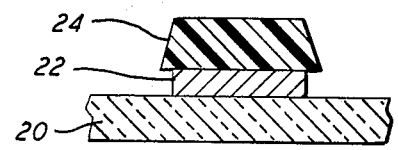
Figure 2:
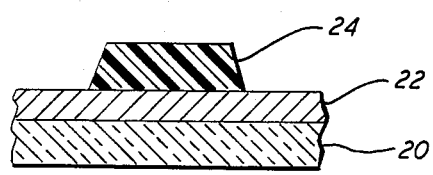
Figure 4:
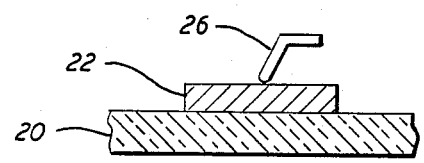

As seen in FIG. 1, an insulating substrate 20 of fused silica has sputter-deposited thereover a film of chrome 22 approximately 1000 Å thick. A thin layer of photoresist 24 is deposited over the chrome. The process steps leading to the production of electrically probe-able patterns are illustrated in FIGS. 1 to 4. A test wafer, as illustrated in FIG. 1, is inserted into a lithographic tool such as a projection printer, for example. The wafer is exposed and developed and shown in FIG. 2. FIG. 3 illustrates the etching step and FIG. 4 illustrates the completed wafer after stripping, with a probe 26 in electrical contact therewith.

Figure 8:
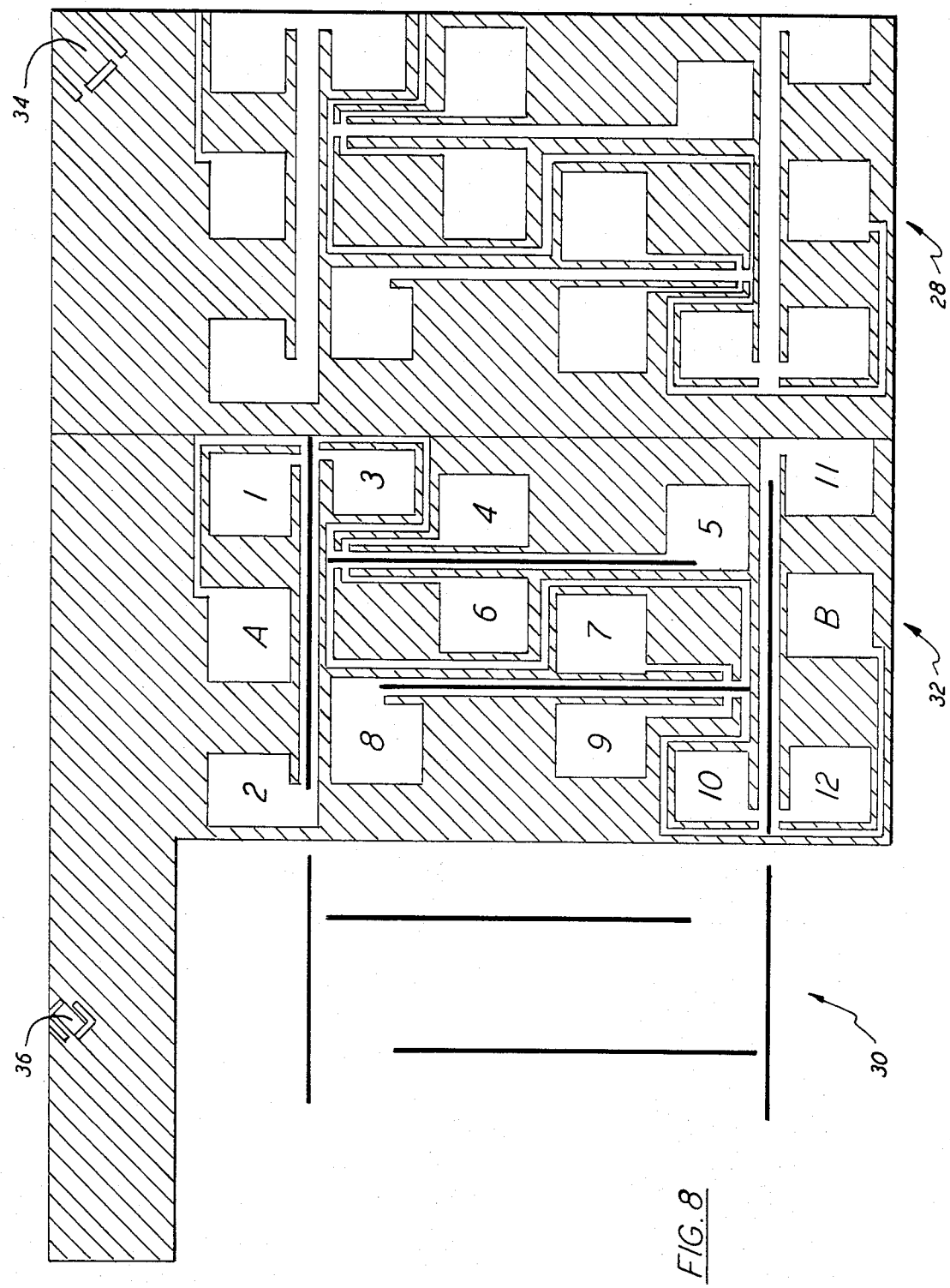
FIG. 8 is a greatly enlarged plan view showing a first level pattern, a second level pattern and an overlay or probe-able pattern.

Referring to FIG. 8, a test mask incorporates both a first level pattern 28 and a second level pattern 30 in order to exclude masked errors from the measurement. The first exposure replicates the mask pattern on a test wafer. The mask is then translated or moved slightly so that the second level pattern on the mask is in alignment with one of the first level patterns on the wafer and a second exposure is made. This superimposes the second level pattern on the first level pattern on the wafer, thereby forming an overlay or probe-able pattern 32 on the wafer. Alignment targets 34 and 36 serve to align the first and second level patterns prior to the second exposure. The overlay or probe-able pattern 32 is used in combination with electrical probes to determine the overlay error by making use of its linewidth measuring capabilities. For each overlay measurement, two sets of four parallel lines or resisters are defined, one set measuring overlay in the X-direction and the other for the Y-direction.

Figure 5:
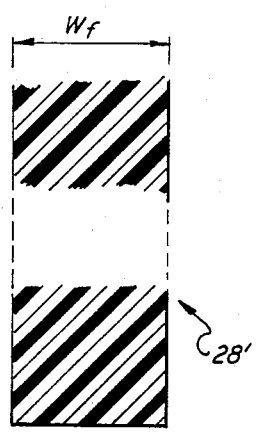
FIGS. 5 to 7 are schematic views showing the formation of an overlay measurement pattern according to the invention.
Figure 6:
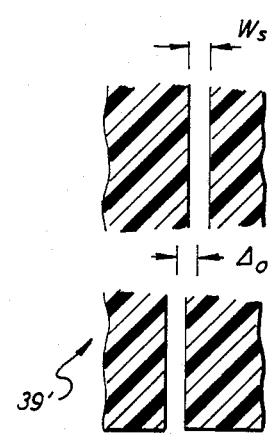
Figure 7:
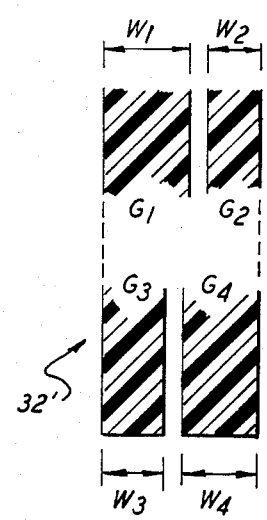

FIGS. 5 to 7 schematically illustrate the measurement pattern in the X-direction. FIG. 5 illustrates the first level pattern 28' having a linewidth $W_f$. FIG. 6 illustrates the second level pattern 30' having a slot width $W_s$. FIG. 7 illustrates the overlay or probe-able pattern 32' having linewidths $W_1$, $W_2$, $W_3$ and $W_4$. If the second level pattern, FIG. 6, consisted of one single slot and it was superimposed on the first level pattern, FIG. 5, with a zero overlay error, the slot would be positioned precisely in the center of the first level pattern such that the linewidths $W_1$ equals $W_2$ and hence the conductance $G_1$ equals $G_2$. The disadvantages of this simple pattern are that the sheet resistance must be determined independently, and that defects in the pattern, such as a short between the two lines can give false electrical measurements.

The pattern according to the invention eliminates the above-mentioned problems. As seen in FIG. 6, the second level pattern comprises a pair of slots offset from one another by a known distance $\Delta_0$, which designed into the mask. $\Delta_0$ is accurately replicated on the wafer even in the presence of linewidth variations. In the case of a perfect overlay, the two slots would be positioned symmetrically about the centerline of the first level pattern. The expression for the overlay error, $\Delta_x$, in terms of the measured conductances, G, and the known dimensions $\Delta_0$ is:

$$\Delta_x = (\Delta_0/2)\,[(G_1 G_3 - G_2 G_4)/(G_1 G_4 - G_2 G_3)] \quad (1)$$

It will be appreciated that only the known distance $\Delta_0$ and the four measured conductances appear in the equation. In other words, the offset error $\Delta_x$ is determined independently of site-to-site sheet resistance and lithography variations. A further advantage of the pattern of the present invention is that the sum of the linewidths and hence capacitance is the same on the top as on the bottom of the pattern. This relationship is given by the equation:

$$G_1 + G_2 = G_3 + G_4 \quad (2)$$

which is independent of overlay error. Verification of equation (2) at each site gives a means of detecting defective test patterns and erroneous measurements.

Referring to FIG. 8, the overlay or test pattern indicated at 32 includes two sets of four parallel lines. One set is sensitive to misregistration in the X-direction, and the other set to misregistration in the Y-direction. The equivalent circuit of the arrangement shown at 32 in FIG. 8 is shown in FIG. 9.

As seen in FIGS. 8 and 9 the pattern is folded such that the current is driven through a racetrack-like course from current pad A to current pad B. Thus, only two current pads are needed to make the measurement in both the X and Y directions. Voltage pads 1 to 12 are provided to receive the probe tips for purposes of measuring the voltage and thereby to determine the conductance as indicated by the expression:

$$G_1{}^y = (I_{A,B}/V_{1,2})$$

Where $I_{AB}$ is the current; $V_{1,2}$ is the voltage drop between the pads 1 and 2 and $G_1{}^y$ is the conductance between the pads 1 and 2.

In like manner the other conductances in the Y-direction are determined by the following expressions:

$$G_2{}^y = (I_{AB}/V_{2,3})$$

$$G_3{}^y = (I_{AB}/V_{10,11})$$

$$G_4{}^y = (I_{A,B}/V_{11,12})$$

Now that the four conductances in the Y-direction have been determined and the offset distance $\Delta_0{}^y$ is preselected and known, substitution in the equation (1) gives the overlay error in the Y-direction.

In a like manner the conductances in the X-direction are determined by the following expressions:

$$G_1{}^x = (I_{A,B}/V_{8,9})$$

$$G_2{}^x = (I_{A,B}/V_{7,8})$$

$$G_3{}^x = (I_{A,B}/V_{5,6})$$

$$G_4{}^x = (I_{A,B}/V_{4,5})$$

Now that the four conductances in the X-direction have been determined and the offset distance $\Delta_0{}^x$ is preselected and known, substitution in the equation (1) gives the overlay error in the X-direction.

That is, the relationship of the conductances $G_1{}^y$; $G_2{}^y$; $G_3{}^y$; $G_4{}^y$ with respect to each other are directly responsive to the horizontal linewidths and the conductances $G_1{}^x$; $G_2{}^x$; $G_3{}^x$; $G_4{}^x$ with respect to each other are directly responsive to the vertical linewidths in FIG. 8 in the same manner as the conductances described hereinbefore in connection with FIG. 7. Therefore the overlay error as expressed in equation (1) and the redundancy equation, equation (2) are also valid for the probe pattern of FIG. 8.

It will thus be seen that the present invention does indeed provide an improved overlay test wafer which accurately measures the overlay error between a base or reference pattern and subsequent pattern levels. Each probe-able pattern is self-calibrated such that only ratios of conductances are required to calculate overlay error. The built-in redundancy of the measurement system enables the automatic detection of defective patterns and erroneous measurements. The pattern is compact.

The concepts of the present invention are applicable to many different types of lithographic instruments such as, for example, projection printers, steppers, X-ray aligners and E-beam writing systems.

Although specific embodiments have been illustrated and described, it will be obvious to those skilled in the art that various modifications may be made without departing from the spirit and scope of the invention which is to be limited solely by the appended claims.

What is claimed is:

1. A test wafer for testing the overlay alignment of a second level pattern over a first level pattern for testing lithographic equipment used in making microcircuits comprising:

a first conductor, means for measuring the conductance of said first conductor;

a second conductor, means for measuring the conductance of said second conductor;

a third conductor, means for measuring the conductance of said third conductor;

a fourth conductor, means for measuring the conductance of said fourth conductor;

said conductors being constructed and arranged so that the conductance of the first conductor with respect to the second conductor, and the conductance of the third conductor with respect to the fourth conductor is indicative of the offset of said first level pattern with respect to said second level of pattern.

2. A test wafer according to claim 1 wherein all of said conductors are disposed in parallel relationship one with respect to the others.

3. A test wafer according to claim 1 wherein each of said means for measuring conductance of said conductors comprises a voltage pad, suitable for contacting by point contact, connected each end of the conductors, respectively.

4. A test wafer according to claim 1 wherein said means for measuring the conductance of said first conductor comprises a first voltage pad connected to one end of said first conductor and a second voltage pad connected to the other end thereof;

said means for measuring the conductance of said second conductor comprising said second voltage pad connected to one end of said second conductor and a third voltage pad connected to the other end thereof;

said means for measuring the conductance of said third conductor comprises a fourth voltage pad connected to one end of said third conductor and a fifth voltage pad connected to the other end thereof;

said means for measuring conductance of said fourth conductor comprises said fifth voltage pad connected to one end of said fourth conductor and a sixth voltage pad connected to the other end therof.

5. A test wafer according to claim 1 wherein the offset error of said first level pattern with respect to said second level pattern is characterized by the relationship:

$$\Delta_x = (\Delta_0/2)\,[(G_1G_3 - G_2G_4)/(G_1G_4 - G_2G_3)]$$

wherein
$\Delta_x$ is the offset error;
$\Delta_0$ is a preselected offset distance;
$G_1$ is the conductance of said first conductor;
$G_2$ is the conductance of said second conductor;
$G_3$ is the conductance of said third conductor; and
$G_4$ is the conductance of said fourth conductor.

6. A test wafer according to claim 5 wherein the following relationship exists:

$$G_1 + G_2 = G_3 + G_4.$$

7. A test wafer for testing the overlay alignment of a second level pattern over a first level pattern for testing lithographic equipment used in making microcircuits comprising:

a first conductor, means for measuring the conductance of said first conductor;

a second conductor, means for measuring the conductance of said second conductor;

a third conductor, means for measuring the conductance of said third conductor;

a fourth conductor, means for measuring the conductance of said fourth conductor;

a fifth conductor, means for measuring the conductance of said fifth conductor;

a sixth conductor, means for measuring the conductance of said sixth conductor;

a seventh conductor, means for measuring the conductance of said seventh conductor;

an eighth conductor, means for measuring the conductance of said eighth conductor, said conductors being constructed and arranged so that the conductance of the first conductor with respect to the second conductor and the conductance of the seventh conductor with respect to the conductance of the eighth conductor is indicative of the offset of said first level pattern with respect to said second level pattern in a first direction; and said conductors being constructed and arranged so that the conductance of said third conductor with respect to said fourth conductor, and the conductance of said fifth conductor with respect to the conductance of the sixth conductor is indicative of the offset of said first level pattern with respect to said second level pattern in a orthogonal direction with respect to said first direction.

8. A test wafer according to claim 7 wherein said first conductor, second conductor, seventh conductor and eighth conductor are parallel one with respect to the others, and wherein said third conductor, fourth conductor, fifth conductor, sixth conductor are disposed in parallel relationship one with respect to the others.

9. A test wafer according to claim 7 wherein said means for measuring the conductance of said first conductor comprises a first voltage pad connected to one end of said first conductor and a second voltage pad connected to the other end thereof;

said means for measuring the conductance of said second conductor comprising said second voltage pad connected to one end of said second conductor and a third voltage pad connected to the other end thereof;

said means for measuring the conductance of said third conductor comprising a fourth voltage pad connected to one end of said third conductor and a fifth voltage pad connected to the other end thereof;

said means for measuring the conductance of said fourth conductor comprising said fifth voltage pad connected to one end of said fourth conductor and a sixth voltage pad connected to the other end thereof;

said means for measuring the conductance of said fifth conductor comprising a seventh voltage pad connected to one end of said sixth conductor and an eighth voltage pad connected to the other end thereof;

said means for measuring the conductance of said sixth conductor comprising said eighth voltage pad connected to one end of said sixth conductor and a ninth voltage pad connected to the other end thereof;

said means for measuring the conductance of said seventh conductor comprising a tenth voltage pad connected to one end of said seventh conductor and an eleventh voltage pad connected to the other end thereof;

said means for measuring the conductance of said eighth conductor comprising said eleventh voltage pad connected to one end of said eighth conductor and a twelfth voltage pad connected to the other end thereof.

10. A test wafer according to claim 9 further comprising a current pad connected to said first voltage pad and a second current pad connected to said twelfth voltage pad.

11. A test wafer according to claim 7 wherein the offset error of said first level pattern with respect to said second level pattern in a first direction is characterized by the relationship:

$$\Delta_x{}^y = \Delta_0{}^y/2)$$
$$[(G_1{}^y G_3{}^y - G_2{}^y G_4{}^y)/(G_1{}^y G_4{}^y - G_2{}^y G_3{}^y)]$$

wherein $\Delta_x{}^y$ is the offset error;

$\Delta_0{}^y$ is a preselected offset distance;

$G_1{}^y$ is the conductance of said first conductor;

$G_2{}^y$ is the conductance of said second conductor;

$G_3{}^y$ is the conductance of said seventh conductor;

$G_4{}^y$ is the conductance of said eighth conductor;

wherein the offset error of said first level pattern with respect to said second level pattern in a direction orthogonal to said first direction is characterized by the relationship:

$$\Delta_x{}^x = (\Delta_0{}^x/2)$$
$$[(G_1{}^x G_3{}^x - G_2{}^x G_4{}^x)/(G_1{}^x G_4{}^x - G_2{}^x G_3{}^x)]$$

wherein $\Delta_x{}^x$ is the offset error in the orthogonal direction;

$\Delta_0{}^x$ is a preselected offset distance in the orthogonal direction;

$G_1{}^x$ is the conductance of said third conductor;

$G_2{}^x$ is the conductance of said fourth conductor;

$G_3{}^x$ is the conductance of said fifth conductor;

$G_4{}^x$ is the conductance of said sixth conductor.

12. A test wafer according to claim 11 characterized by the relationship $$G_1{}^y + G_2{}^y = G_3{}^y + G_4{}^y$$

and further characterized by:

$$G_1{}^x + G_2{}^x = G_3{}^x + G_4{}^x.$$

13. A test wafer according to claim 7 wherein four of said conductors extend in a first direction and the other four extend in an orthogonal direction with respect to said first direction.

14. A test wafer according to claim 7 wherein said first conductor, second conductor, seventh conductor and eighth conductor extend in a first direction, and said third conductor, fourth conductor, fifth conductor and sixth conductor extend in an orthogonal direction with respect to said first direction.

* * * * *